United States Patent [19]

Alberkrack et al.

[11] Patent Number: 4,980,791
[45] Date of Patent: Dec. 25, 1990

[54] UNIVERSAL POWER SUPPLY MONITOR CIRCUIT

[75] Inventors: Jade H. Alberkrack, Tempe; Eric W. Tisinger, Chandler, both of Ariz.

[73] Assignee: Motorola, Inc., Schaumburg, Ill.

[21] Appl. No.: 474,908

[22] Filed: Feb. 5, 1990

[51] Int. Cl.$^5$ .................................................. G08B 21/00
[52] U.S. Cl. ...................................... 361/90; 340/662; 340/663
[58] Field of Search ............................ 361/90, 91, 92; 340/662, 663; 323/299

[56] References Cited

U.S. PATENT DOCUMENTS

| | | | |
|---|---|---|---|
| 4,311,994 | 1/1982 | Kuribayashi | 340/662 |
| 4,623,833 | 11/1986 | Edwards | 361/90 |
| 4,724,375 | 2/1988 | Dittmar | 340/663 |
| 4,951,171 | 8/1990 | Tran et al. | 361/90 |

FOREIGN PATENT DOCUMENTS 138474  7/1985  Japan .................................. 340/662

OTHER PUBLICATIONS

Bishop, "Over and Under Voltage Sensor Uses Comparators," Elect. Eng., vol. 49, No. 590, p. 19, Apr., 1977.

Primary Examiner—William H. Beha, Jr.
Attorney, Agent, or Firm—Michael D. Bingham

[57] ABSTRACT

A power supply monitoring circuit for operating in a plurality of modes comprising first and second single input comparators coupled to first and second inputs, respectively, for sensing the voltage levels thereof. A reference circuit for generating a reference voltage at a first output. A programming circuit coupled to the outputs of the first and second single input comparators and being responsive to a third input for providing the selection of plurality of operation modes and for providing second and third outputs which are function of the voltage levels appearing at the first and second inputs.

9 Claims, 5 Drawing Sheets

UNIVERSAL POWER SUPPLY MONITOR CIRCUIT

BACKGROUND OF THE INVENTION

The present invention relates to monitoring voltage levels and, more particularly, to a universal power supply monitor circuit for operating in a plurality of modes.

Power supply monitor circuits are well known in the art and typically provide a method to detect when a positive or negative power supply voltage level is above a predetermined level, below a predetermined level, outside a predetermined voltage range (window), or within a predetermined voltage range (window). These detection schemes comprise the various modes that can be utilized by a power supply monitor circuit, such as; a positive over/under voltage (window) detector, a negative over/under voltage (window) detector, a dual positive overvoltage detector, a dual negative overvoltage detector, a dual positive undervoltage detector, a dual negative undervoltage detector, a positive and negative overvoltage detector, and a positive and negative undervoltage detector.

At least one prior art power supply monitor circuit includes a multiple integrated chip configuration whereby several separate integrated circuit chips are cascaded to perform the aforementioned modes. However, multiple chips typically require separate bias supplies because of the large drop out voltage of the integrated circuit and comparators. Furthermore, a multiple chip approach requires considerable more silicon and printed circuit board area accompanied by an increase in power dissipation.

Prior art power supply monitor circuits have utilized a dedicated single chip to operate in only one or two of the many aforementioned modes. This approach, of course, has limited flexibility because only a fraction of the modes can be utilized.

Hence, a need exists for a single integrated circuit chip power supply monitor circuit with exceptional flexibility.

SUMMARY OF THE INVENTION

Accordingly, it is an object of the present invention to provide an improved power supply monitor circuit with exceptional flexibility.

Another object of the present invention is to provide a power supply monitor circuit, in a single integrated chip, having exceptional flexibility.

In carrying out the above and other objects of the present invention, there is provided a power supply monitoring circuit for operating in a plurality of modes comprising first and second single input comparators coupled to first and second inputs, respectively; a reference circuit for generating a reference voltage at a first output; and a programming circuit coupled to the outputs of the first and second single input comparators and being responsive to a third input for providing second and third outputs which are functions of the voltage levels appearing at the first and second inputs, while the third input provides the selection of the plurality of modes of operation.

The above and other objects, features and advantages of the present invention will be better understood from the following detailed description taken in conjunction with the accompanying drawings.

DETAILED DESCRIPTION OF THE INVENTION

Figure 1:
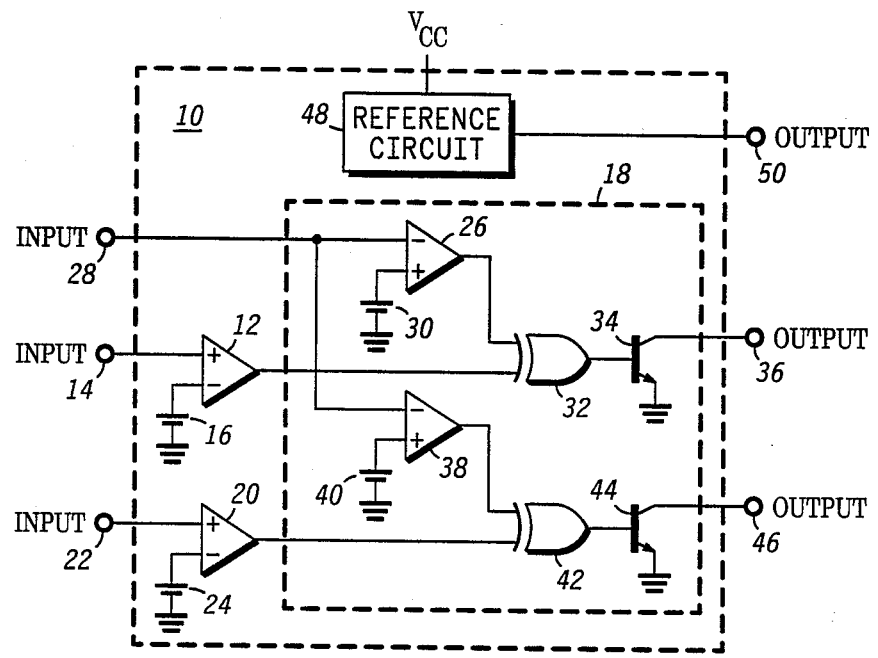
FIG. 1 is a detailed schematic diagram illustrating the preferred embodiment of the present invention.

Referring to FIG. 1, there is illustrated a detailed schematic diagram of the preferred embodiment of the present invention 10 comprising comparator 12 having a first input coupled to input terminal 14, a second input coupled to ground reference by independent voltage source 16 and an output coupled to programming circuit 18. Comparator 20 has a first input coupled to input terminal 22, a second input coupled to ground reference by independent voltage source 24 and an output coupled to programming circuit 18. Comparators 12 and 20 are referred to as single input comparators since each has only one input for external use while the other input is coupled to ground reference usually through an independent voltage source. Furthermore, it is known that comparators 12 and 20, along with accompanying independent voltage sources 16 and 24, can be replaced by any means for sensing the voltage levels at input terminals 14 and 22.

Preferred embodiment 10 further comprises programming circuit 18 which includes comparator 26 having a first input coupled to input terminal 28, a second input coupled to ground reference by independent voltage source 30 and an output coupled to a first input of exclusive OR (XOR) gate 32. The second input of exclusive OR gate 32 is coupled to the output of comparator 12 while the output of exclusive OR gate 32 is coupled to the base of transistor 34. The collector of transistor 34 is coupled to output terminal 36 while its emitter is returned to ground reference. Programming circuit 18 further includes comparator 38 which has a first input coupled to input terminal 28, a second input coupled to ground reference by independent voltage source 40, and an output coupled to a first input of exclusive OR gate 42. The second input of exclusive OR 42 is coupled to the output of comparator 20 while the output of exclusive OR gate 42 is coupled to the base of transistor 44. The collector of transistor 44 is coupled to output terminal 46 while its emitter is returned to ground reference.

Preferred embodiment 10 further includes reference circuit 48 coupled to a first supply voltage terminal at which the operating potential $V_{CC}$ is applied for providing a predetermined voltage output at output terminal 50.

Preferred embodiment 10 is designed such that independent voltage source 30 is greater than the predetermined voltage reference at output terminal 50 and such that independent voltage source 40 is less than the predetermined voltage reference at output terminal 50. Furthermore, independent voltage sources 16 and 24 are not dependent upon the values of independent voltage sources 30 and 40 or the predetermined voltage reference occurring at output terminal 50, because they simply set up a predetermined threshold for single input comparators 12 and 20, respectively. However, independent voltage sources 16 and 24 typically provide voltage levels less than the voltage level of the predetermined voltage reference at output terminal 50 to allow for negative voltage sensing.

In operation, the logic level of the first inputs of exclusive OR gates 32 and 42 are determined by the voltage level appearing at input terminal 28. It is assumed that the operation of comparators 12, 20, 26 and 38 is well known by one of ordinary skill in the art, but a brief description is presented for convenience. If the voltage level at input terminal 28 is less than the voltage level of independent voltage source 30 then a logic high will appear at the first input of XOR gate 32, or else a logic low will result. And similarly, if the voltage level at input terminal 28 is less than the voltage level of independent voltage source 40 then a logic high will appear at the first input of XOR gate 42, or else a logic low will result. Furthermore, the logic levels of the second inputs of XOR gates 32 and 42 are determined by the voltage levels occurring at input terminals 14 and 22, respectively. Therefore, if the voltage level at input terminal 14 is greater than the voltage level of independent voltage source 16 then a logic high will occur at the second input of exclusive OR gate 32, or else a logic low will result. Similarly, if the voltage level at input terminal 22 is greater than the voltage level of independent voltage source 24 then a logic high will occur at the second input of exclusive OR gate 42, or else a logic low will result. The operation of exclusive OR gates 32 and 42 is well known in the art and will not be discussed in detail. Furthermore, when the outputs of exclusive OR gates 32 and 42 are a logic high, transistors 34 and 44, respectively, will be turned on and current will be able to flow through light emitting diode (LED) 54 and resistor 56, in FIG. 2. For preferred embodiment 10, if LED 54 has current flowing through it and is ON, then this will signify that an error condition has occurred at either input terminal 14 or input terminal 22, or both. However, it is realized that the reverse condition could easily be obtained by switching the inputs on the comparators, resulting in LED turning OFF when an error condition has occurred at either input terminal 14 or input terminal 22, or both.

Preferred embodiment 10 is designed to operate in a plurality of modes for monitoring power supply voltage levels which are coupled to input terminals 14 and 22. In particular, the preferred embodiment 10 can be configured to operate in any of the following modes: a positive, over/undervoltage detector, a negative over/undervoltage detector, a dual positive overvoltage detector, a dual negative overvoltage detector, a dual positive undervoltage detector, a dual negative undervoltage detector, a positive and negative overvoltage detector and a positive and negative undervoltage detector. The primary difference between the configuration of each of these modes is the voltage level applied at input terminal 28 which is coupled to programming circuit 18 for providing the selection of one of the plurality of aforementioned modes. Another significant difference between the configuration of each of these modes is the resistor scaling required to provide various voltage levels at input terminals 14 and 22 in order to comply with the switching thresholds of comparators 12 and 20, respectively. These noted differences and others are better illustrated in FIGS. 2–9 and will be described in detail in the following paragraphs.

Figure 2:
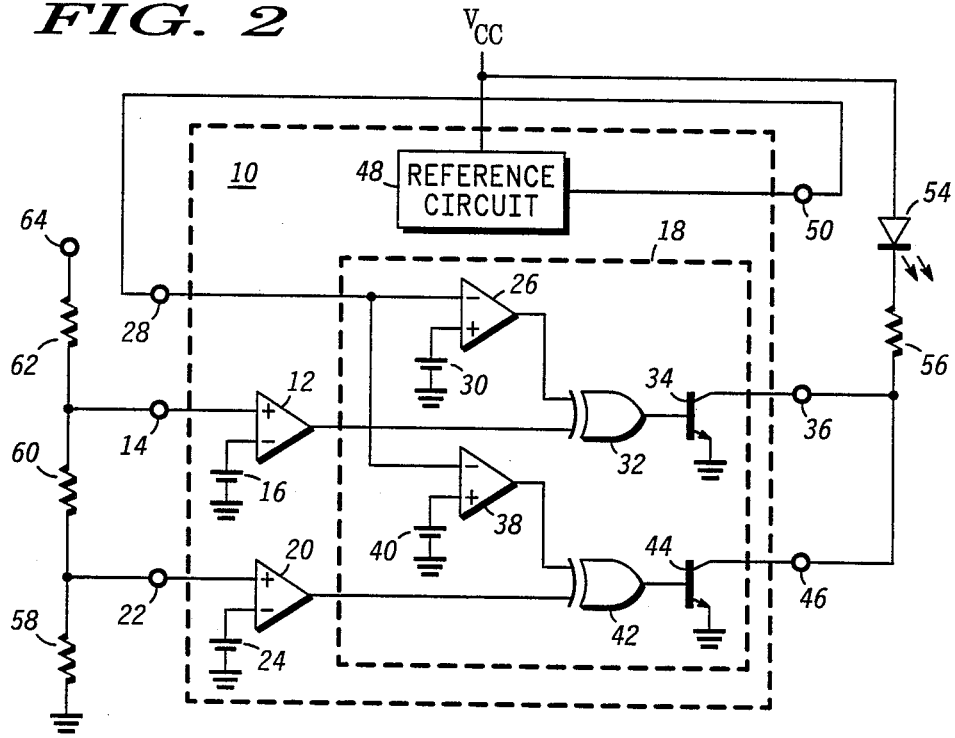
FIG. 2 is a detailed schematic diagram illustrating the preferred embodiment of the present invention in a first mode of operation.

Referring to FIG. 2, there is illustrated preferred embodiment 10 configured in a first mode of operation and the components that are similar to those of FIG. 1 have been designated by the same reference numerals. The circuit of FIG. 2 comprises preferred embodiment 10 configured to operate in a positive over/under voltage detector mode which detects when the voltage level of a power supply generating a positive voltage level moves outside a predetermined voltage range (window). As for all modes, output terminals 36 and 46 are coupled to operating potential $V_{CC}$ by the series combination of light emitting diode 54 and resistor 56. However, it is understood that resistor 56 may be coupled to $V_{CC}$ or any other positive voltage source with or without LED 54 where LED 54 is shown as only one possible means of indicating output states. For the first mode of operation, output terminal 50 is coupled to input terminal 28. Furthermore, input terminal 22 is coupled to ground reference by resistor 58 and to input terminal 14 by resistor 60. Input terminal 14 is coupled to terminal 64 by resistor 62 whereby terminal 64 is typically coupled to the output of the power supply which generates a positive voltage level.

In operation, resistors 58, 60 and 62 produce predetermined voltage levels at input terminals 14 and 22 thereby creating a voltage range or window for the power supply coupled to terminal 64 to operate inside of without signalling an error condition. As aforementioned, independent voltage source 30 is greater than the reference voltage at output terminal 50 and, thus, a logic high appears at the first input of exclusive or gate 32. Also, independent voltage source 40 is less than the voltage level at output terminal 50 and, thus, a logic low appears at the first input terminal of exclusive OR gate 42. It should now be clear on how the voltage level applied at input terminal 28 can be used to select a mode of operation. Therefore, if the voltage level at terminal 64 falls below a predetermined voltage level such that the voltage at input terminal 14 falls below a predetermined threshold as set up by independent voltage source 16, comparator 12 changes from a high state to a low state and provides a logic low at the second input of exclusive OR gate 32. As understood, this produces a logic high at the output of exclusive OR gate 32 thereby turning on transistor 34 and light emitting diode 54 which signifies that an undervoltage error condition has occurred at terminal 64. On the other hand, if the voltage level at terminal 64 rises above a predetermined level such that the voltage level at input terminal 22 rises above a predetermined voltage level as set up by independent voltage source 24, comparator 20 changes from a low state to a high state which produces a logic high at the output of exclusive OR gate 42. This has the effect of turning on transistor 44 and light emitting diode 54 thereby signifying that an overvoltage error condition has occurred at terminal 64. In summary, for the first mode of operation, when the voltage level at input 64 moves outside the voltage window as set up by the resistor divider network comprising resistors 58, 60 and 62, light emitting diode 54 turns on and signifies an overvoltage or undervoltage error condition.

Figure 3:
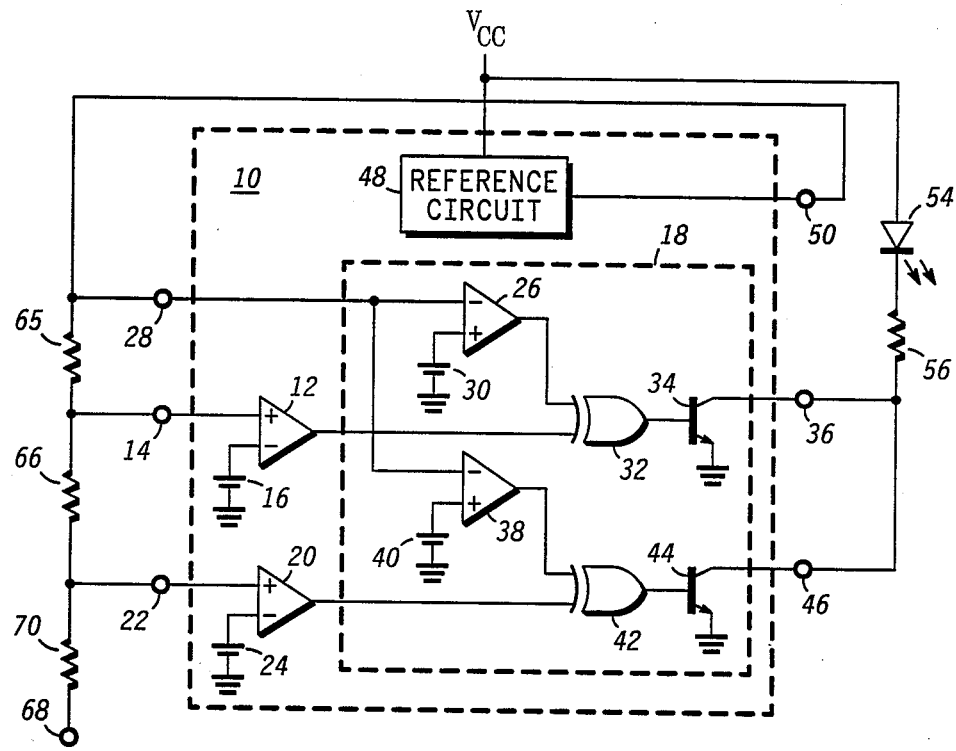
FIG. 3 is a detailed schematic diagram illustrating the preferred embodiment of the present invention in a second mode of operation.

Referring to FIG. 3, preferred embodiment 10 is configured in a second mode of operation and the components that are similar to FIGS. 1 and 2 are designated by the same reference numerals. For the second mode of operation, preferred embodiment 10 functions as a negative over/undervoltage detector which detects when the voltage level of a power supply generating a negative voltage level moves outside a predetermined voltage range (window). Output terminal 50 is coupled to input terminal 28 and to input terminal 14 by resistor 65. Also, input terminal 14 is coupled to input terminal 22 by resistor 66 and input terminal 22 is coupled to terminal 68 by resistor 70 whereby terminal 68 is typically coupled to a power supply which produces a negative voltage level. Similar to the operation of the circuit in FIG. 2, whenever the voltage level at terminal 68 falls outside the predetermined voltage window as set up by the resistor divider network comprising resistors 65, 66 and 70, light emitting diode 54 turns on and signifies an over or under voltage error condition occurring at terminal 68. It is worth noting for clarification purposes that voltage levels less than or more than, refer to the absolute magnitude of the voltage level with respect to ground.

The details of the operation of the circuit in FIG. 3 are not described as they were for the circuit of FIG. 2, however, it is assumed that once the operation of FIGS. 1 and 2 is understood, the operation of the circuit of FIG. 3, as well as FIGS. 4–9, are easily understood by one of ordinary skill in the art.

Figure 4:
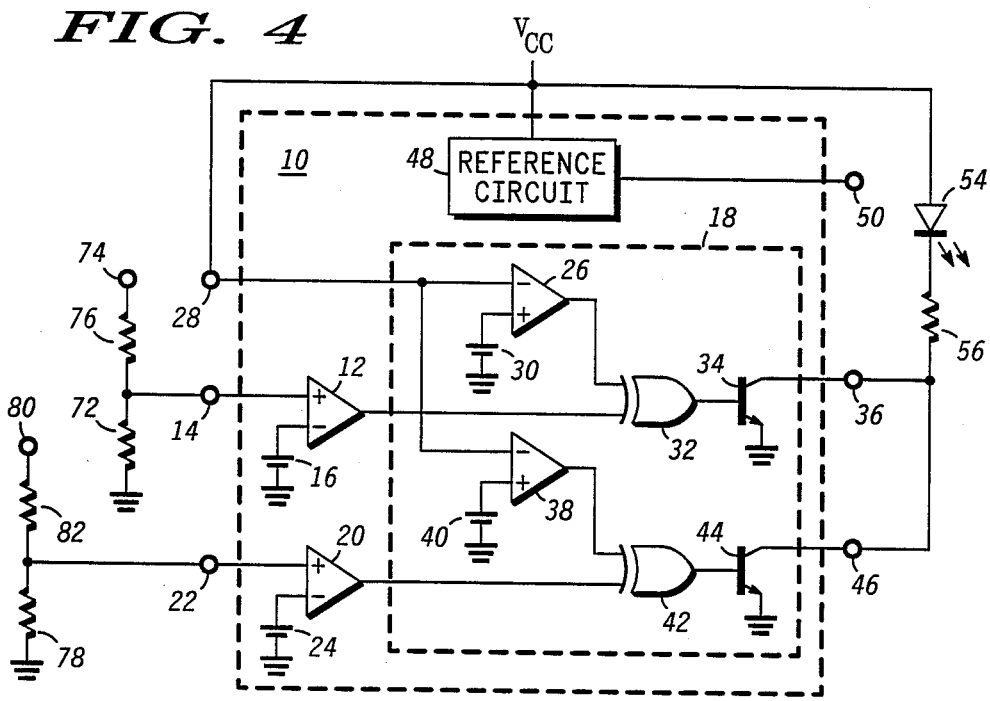
FIG. 4 is a detailed schematic diagram illustrating the preferred embodiment of the present invention in a third mode of operation.

Referring to FIG. 4, preferred embodiment 10 is configured in a third mode of operation and the components that are similar to FIGS. 1 and 2 are designated by the same reference numerals. For the third mode of operation, preferred embodiment 10 functions as as a dual positive overvoltage detector which detects when the voltage level of one or two power supplies have become more positive than predetermined levels as set up by independent voltage sources 16 and 24, respectively. Input terminal 28 is coupled to operating potential $V_{CC}$ while output terminal 50 is left floating. Input terminal 14 in coupled to ground reference by resistor 72 and to terminal 74 by resistor 76. Also, input terminal 22 is coupled to ground reference by resistor 78 and to terminal 80 by resistor 82 whereby terminals 74 and 80 are typically coupled to power supplies which produce positive voltage levels. In operation, whenever the voltage levels at terminals 74 and/or 80 become more positive than predetermined voltage levels, light emitting diode 54 turns on and signifies that an overvoltage error condition has occurred at one or both of the terminals 74 and 80. It is worth noting that instead of coupling output terminal 46 to output terminal 36 and through resistor 56 and diode 54 to $V_{CC}$, it is understood that output terminal 46 could be coupled to $V_{CC}$ through a resistor and a diode different and separate from that of resistor 56 and diode 54 so that the lighting of each individual diode would signify which input terminal (14 or 22) is out of range.

Figure 5:
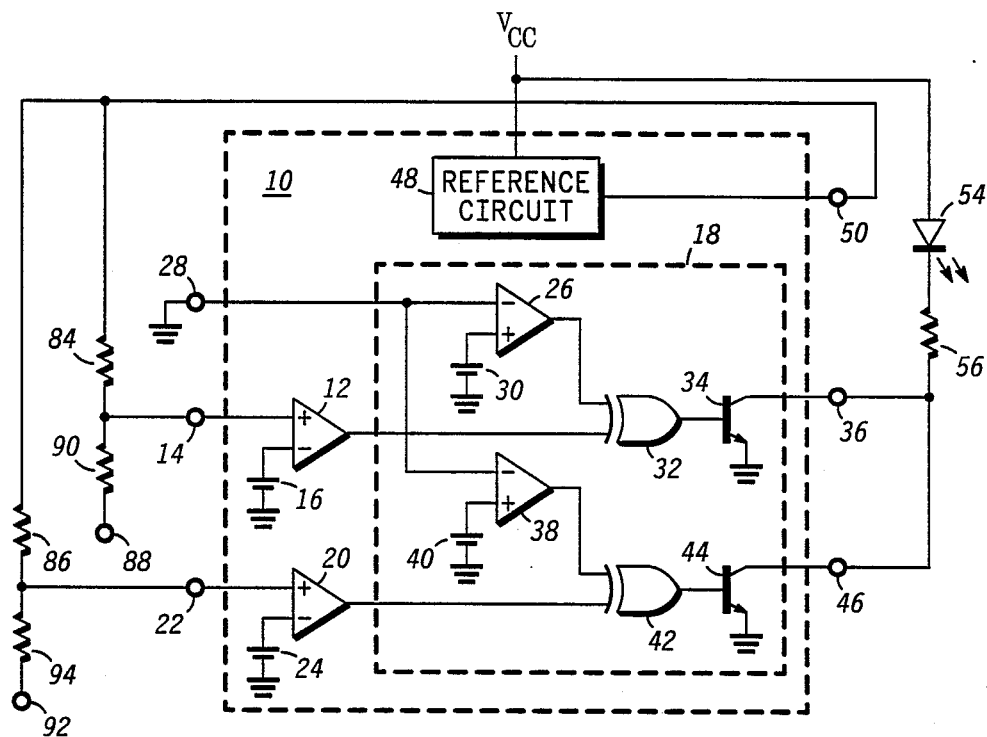
FIG. 5 is a detailed schematic diagram illustrating the preferred embodiment of the present invention in a fourth mode of operation.

Referring to FIG. 5, preferred embodiment 10 is configured in a fourth mode of operation and the components that are similar to FIGS. 1 and 2 are designated by the same reference numerals. For the fourth mode of operation, preferred embodiment 10 functions as a dual negative overvoltage detector which detects when the voltage level of one or two power supplies have become more negative than predetermined levels as set up by resistor divider networks 84 and 90, and 86 and 94, respectively. Input terminal 28 is coupled to ground reference while output terminal 50 is coupled to input terminal 14 by resistor 84 and to input terminal 22 by resistor 86. Input terminal 14 is also coupled to terminal 88 by resistor 90 and input terminal 22 is coupled to terminal 92 by resistor 94 whereby terminal 88 and 92 are typically coupled to power supplies which produce negative voltage levels. In operation, similar to the operation of the circuit of FIG. 4, whenever the voltage levels at terminal 88 and/or 90 become more negative than predetermined voltage levels, light emitting diode 54 turns on and signifies that an overvoltage error condition has occurred at either one or both of the terminals 88 and 92.

Figure 6:
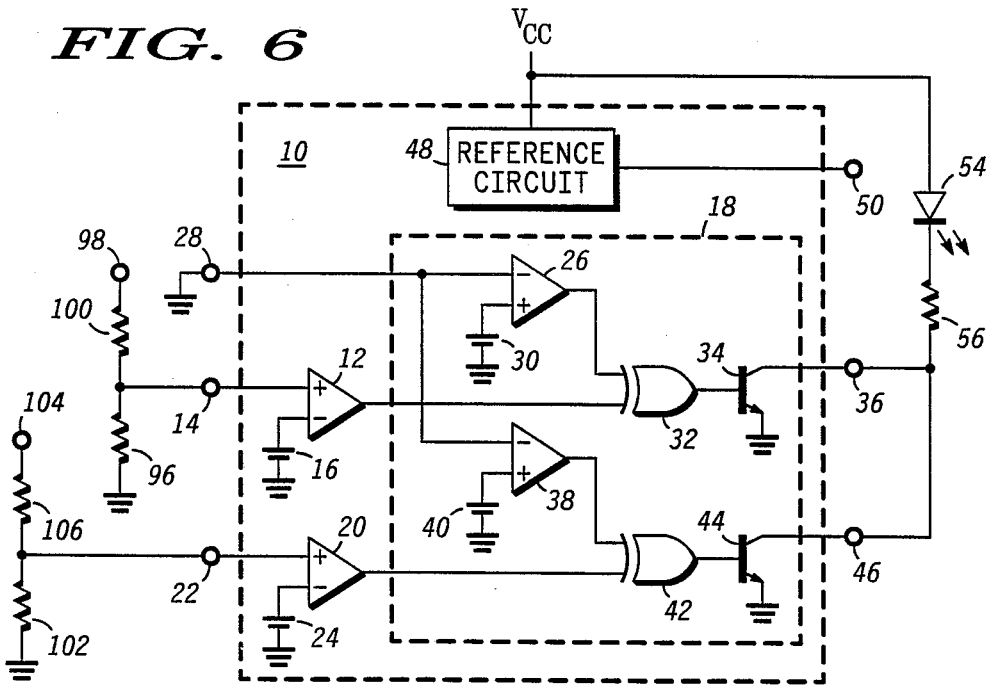
FIG. 6 is a detailed schematic diagram illustrating the preferred embodiment of the present invention in a fifth mode of operation.

Referring to FIG. 6, preferred embodiment 10 is configured in a fifth mode of operation and the components that are similar to FIGS. 1 and 2 are designated by the same reference numerals. For the fifth mode of operation, preferred embodiment 10 functions as a dual positive undervoltage detector which detects when the voltage level of one or two power supplies have become less positive than predetermined voltage levels. Input terminal 28 is coupled to ground reference while output terminal 50 is left floating. Input terminal 14 is coupled to ground reference by resistor 96 and to terminal 98 by resistor 100. Also, input terminal 22 is coupled to ground reference by resistor 102 and to terminal 104 by resistor 106 whereby terminals 98 and 104 are typically coupled to power supplies which produce positive voltage levels. Similar to the circuit of FIG. 4, whenever the voltage level at terminals 98 and/or 104 fall below predetermined voltage levels, respectively, light emitting diode 54 turns on and signifies that an undervoltage error condition has occurred at either one or both of the terminals 98 and 104.

Figure 7:
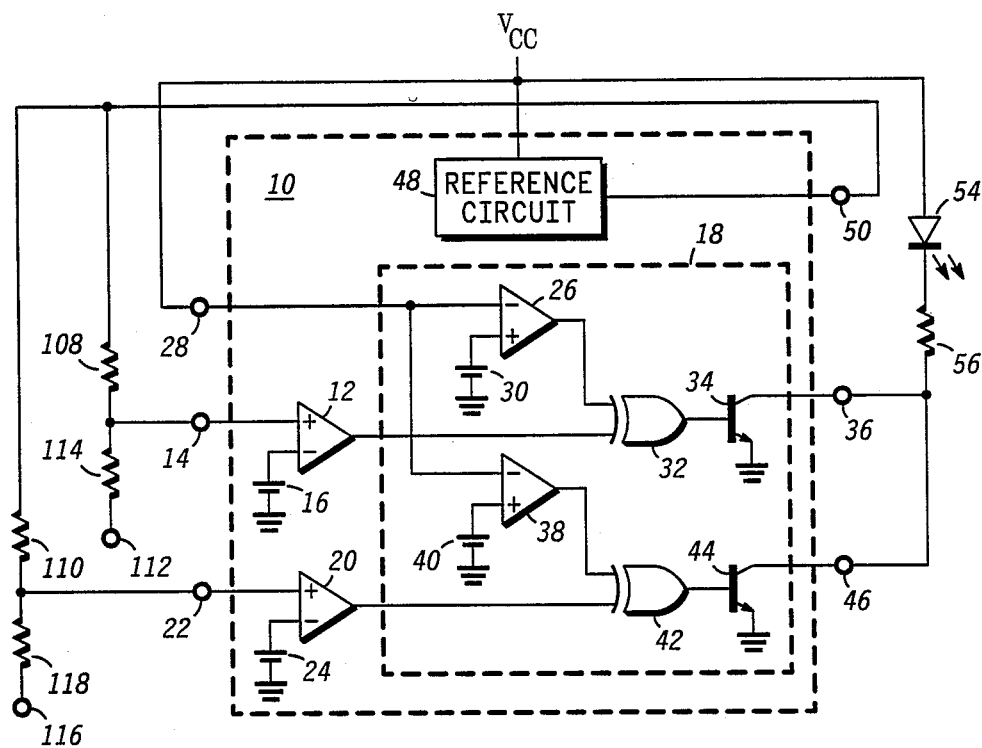
FIG. 7 is a detailed schematic diagram illustrating the preferred embodiment of the present invention in a sixth mode of operation.

Referring to FIG. 7, preferred embodiment 10 is configured in a sixth mode of operation and the components that are similar to FIGS. 1 and 2 are designated by the same reference numerals. For the sixth mode of operation, preferred embodiment 10 functions as a dual negative undervoltage detector which detects when the voltage level of one or two power supplies have become less negative than a predetermined voltage level. Input terminal 28 is coupled to operating potential $V_{CC}$ while output terminal 50 is coupled to input terminal 14 by resistor 108 and to input terminal 22 by resistor 110. Input terminal 14 is further coupled to terminal 112 by resistor 114 while input terminal 22 is coupled to terminal 116 by resistor 118 whereby terminals 112 and 116 are typically coupled to power supplies which produces negative voltage levels. Similar to the circuit of FIG. 6, whenever the voltage levels at terminals 112 and/or 116 become less negative than predetermined voltage levels, respectively, light emitting diode 54 turns on and signifies that a negative undervoltage error condition has occurred at one or both of the terminals 112 and 116.

Figure 8:
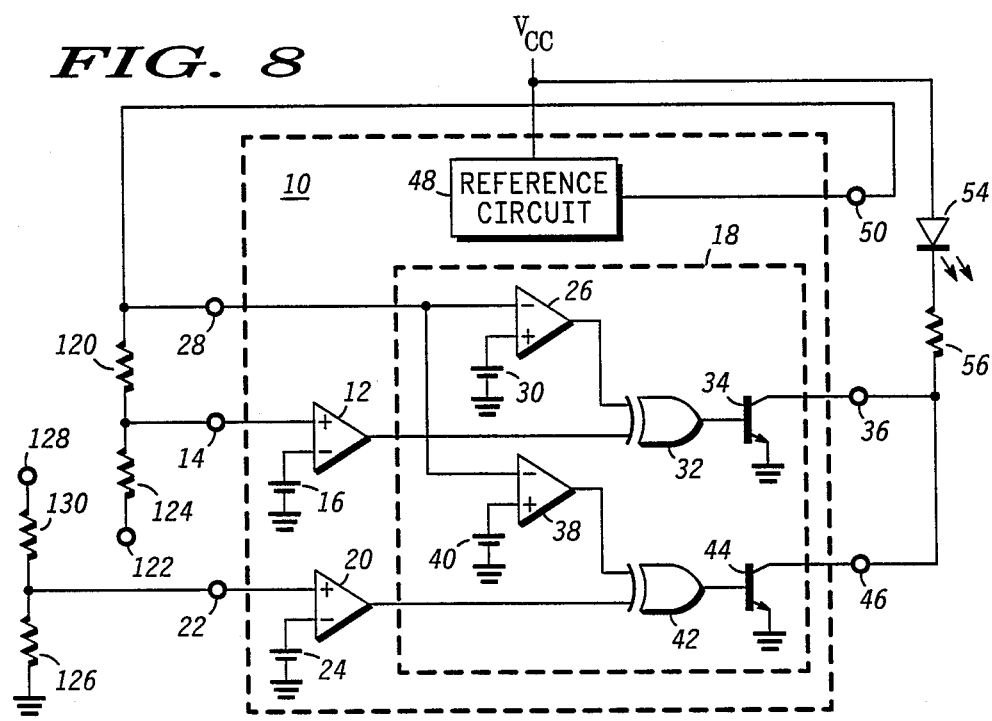
FIG. 8 is a detailed schematic diagram illustrating the preferred embodiment of the present invention in a seventh mode of operation.

Referring to FIG. 8, preferred embodiment 10 is configured in a seventh mode of operation and the components that are similar to FIGS. 1 and 2 are designated by the same reference numerals. For the seventh mode of operation, preferred embodiment 10 functions as a positive and negative overvoltage detector which detects when a power supply with a positive voltage becomes more positive than a predetermined voltage level and/or when a power supply with a negative voltage becomes more negative than a predetermined voltage level. Output terminal 50 is coupled to input terminal 28 and to input terminal 14 by resistor 120. Input terminal 14 is further coupled to terminal 122 by resistor 124. Also, input terminal 22 is coupled to ground reference by resistor 126 and to terminal 128 by resistor 130 whereby terminal 128 is typically coupled to a power supply which produces a positive voltage level and terminal 122 is typically coupled to a power supply which produces a negative voltage level. In operation, whenever the voltage level at terminal 122 becomes more negative than a predetermined voltage level, light emitting diode 54 turns on and signifies that an overvoltage error condition has occurred at terminal 122. Also, whenever the voltage level at terminal 128 becomes more positive than a predetermined voltage level, light emitting diode 54 turns on and signifies that an overvoltage error condition has occurred at terminal 128.

Figure 9:
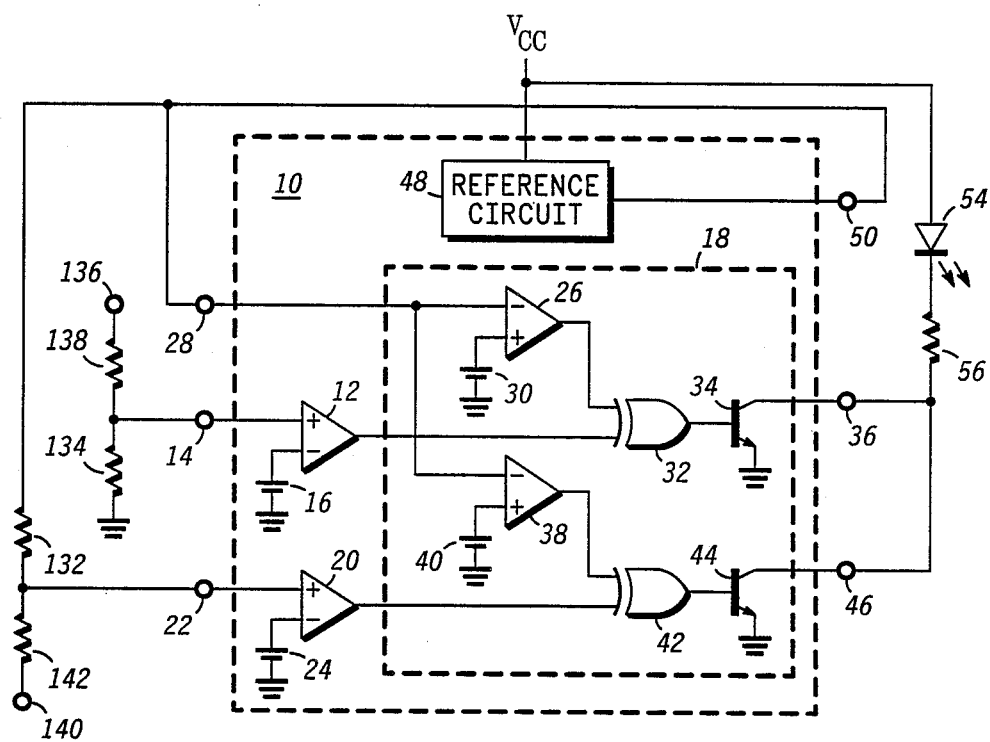
FIG. 9 is a detailed schematic diagram illustrating the preferred embodiment of the present invention in an eighth mode of operation.

Referring to FIG. 9, preferred embodiment 10 is configured in an eighth mode of operation and the components that are similar to FIGS. 1 and 2 are designated by the same reference numerals. For the eighth mode of operation, preferred embodiment 10 functions as a positive and negative undervoltage detector which detects when a power supply with a positive voltage becomes less positive than a predetermined voltage level and when a power supply with a negative voltage becomes less negative than a predetermined voltage level. Output terminal 50 is coupled to input terminal 28 and to input terminal 22 by resistor 132. Input terminal 14 is coupled to ground reference by resistor 134 and to terminal 136 by resistor 138 whereby terminal 136 is typically coupled to a power supply which produces a positive voltage level. Input terminal 22 if further coupled to terminal 140 by resistor 142 whereby terminal 140 is typically coupled to a power supply which produces a negative voltage level. In operation, whenever the voltage level at terminal 136 becomes less positive than a predetermined voltage level, light emitting diode 54 turns on and signifies that an undervoltage error condition has occurred at terminal 136. Also, whenever the voltage level at terminal 140 becomes less negative than a predetermined voltage level, light emitting diode 54 turns on and signifies that an undervoltage error condition has occurred at terminal 140.

By now it should be appreciated that there has been provided a novel power supply monitor circuit with increased flexibility to operate in a plurality of modes.

What is claimed:

1. A power supply monitor circuit for operating in a plurality of modes, comprising:
    means coupled to first and second inputs of the monitor circuit for sensing the voltage levels applied thereat;
    reference means for generating a reference voltage at a first output; and
    programming means coupled to said means and being responsive to a signal applied at a third input of the monitor circuit for providing the selection of said plurality of modes and for providing second and third output signals at respective outputs of the monitor circuit which are a function of the voltage levels appearing at said first and second inputs.

2. The power supply monitor circuit according to claim 1 wherein said means includes:
    a first comparator having a first input coupled to said first input of the monitor circuit, a second input coupled to a first independent voltage source, and an output coupled to said programming means; and
    a second comparator having a first input coupled to said second input of the monitor circuit, a second input coupled to a second independent voltage source, and an output coupled to said programming means.

3. The power supply monitor circuit according to claim 2 wherein said programming means includes:
    a first comparator having a first input coupled to said third input of the monitor circuit, a second input coupled to a third independent voltage source which provides a voltage level that is greater than the voltage level of said reference voltage, and an output;
    a second comparator having a first input coupled to said third input of the monitor circuit, a second input coupled to a fourth independent voltage source which provides a voltage level that is less than the voltage level of said reference voltage, and an output;
    a first exclusive OR gate having a first input coupled to said output of said first comparator of said programming means, a second input coupled to said output of said first comparator of said means, and an output;
    a second exclusive OR gate having a first input coupled to said output of said second comparator of said programming means, a second input coupled to said output of said second comparator of said means, and an output;
    a first transistor having a collector coupled to said second output of the monitor circuit, a base coupled to said output of said first exclusive OR gate, and an emitter coupled to a first power supply voltage terminal; and
    a second transistor having a collector coupled to said third output of the monitor circuit, a base coupled to said output of said second exclusive OR gate, and an emitter coupled to said first power supply voltage terminal.

4. In an integrated circuit, a power supply monitor circuit for operating in a plurality of modes, comprising:
    means coupled to first and second pins of the monitor circuit for sensing the voltage levels thereof;
    reference means for generating a reference voltage at a third pin of the monitor circuit; and
    programming means coupled to said means and being responsive to a voltage signal applied at a fourth pin of the monitor circuit for providing the selection of said plurality of modes, said programming means provides outputs at fifth and sixth pins of the monitor circuit which are a function of the voltage levels appearing at said first and second pins of the monitor circuit.

5. The power supply monitor circuit according to claim 4 wherein said means includes;
    a first comparator having a first input coupled to said first pin of the monitor circuit, a second input coupled to a first independent voltage source, and an output coupled to said programming means; and a second comparator having a first input coupled to said second pin of the monitor circuit, a second input coupled to a second independent voltage source, and an output coupled to said programming means.

6. The power supply monitor circuit according to claim 5 wherein said programming means includes:
   a first comparator having a first input coupled to said fourth pin of the monitor circuit, a second input coupled to a third independent voltage source which provides a voltage level that is greater than the voltage level of said reference voltage, and an output;
   a second comparator having a first input coupled to said fourth pin of the monitor circuit, a second input coupled to a fourth independent voltage source which provides a voltage level that is less than the voltage level of said reference voltage, and an output;
   a first exclusive OR gate having a first input coupled to said output of said first comparator of said programming means, a second input coupled to said output of said first comparator of said means, and an output;
   a second exclusive OR gate having a first input coupled to said output of said second comparator of said programming means, a second input coupled to said output of said second comparator of said means, and an output;
   a first transistor having a collector coupled to said fifth pin of the monitor circuit, a base coupled to said output of said first exclusive OR gate, and an emitter coupled to a first power supply voltage terminal; and
   a second transistor having a collector coupled to said sixth pin of the monitor circuit, a base coupled to said output of said second exclusive OR gate, and an emitter coupled to said first power supply voltage terminal.

7. An integrated power supply monitor circuit in an 8-pin package having a power supply pin and a ground pin, for operating in a plurality of modes, comprising:
   means coupled to first and second pins of the integrated power supply monitor circuit for sensing the voltage levels thereof;
   reference means coupled to the power supply pin of the integrated power supply monitor circuit for generating a reference voltage at a third pin of the integrated power supply monitor circuit; and
   programming means coupled to said means and being responsive to a voltage signal applied at a fourth pin of the integrated power supply monitor circuit for providing the selection of said plurality of modes and for providing outputs at fifth and sixth pins of the integrated power supply monitor circuit which are a function of the voltage levels appearing at said first and second pins of the integrated power supply monitor circuit.

8. The integrated power supply monitor circuit according to claim 7 wherein said means includes;
   a first comparator having a first input coupled to said first pin of the integrated power supply monitor circuit, a second input coupled to a first independent voltage source, and an output coupled to said programming means; and
   a second comparator having a first input coupled to said second pin of the integrated power supply monitor circuit, a second input coupled to a second independent voltage source, and an output coupled to said programming means.

9. The integrated power supply monitor circuit according to claim 8 wherein said programming means includes:
   a first comparator having a first input coupled to said fourth pin of the integrated power supply monitor circuit, a second input coupled to a third independent voltage source which provides a voltage level that is greater than the voltage level of said reference voltage, and an output;
   a second comparator having a first input coupled to said fourth pin of the integrated power supply monitor circuit, a second input coupled to a fourth independent voltage source which provides a voltage level that is less than the voltage level of said reference voltage, and an output;
   a first exclusive OR gate having a first input coupled to said output of said first comparator of said programming means, a second input coupled to said output of said first comparator of said means, and an output;
   a second exclusive OR gate having a first input coupled to said output of said second comparator of said programming means, a second input coupled to said output of said second comparator of said means, and an output;
   a first transistor having a collector coupled to said fifth pin of the integrated power supply monitor circuit, a base coupled to said output of said first exclusive OR gate, and an emitter coupled to the ground pin of the integrated power supply monitor circuit; and
   a second transistor having a collector coupled to said sixth pin of the integrated power supply monitor circuit, a base coupled to said output of said second exclusive OR gate, and an emitter coupled to the ground pin of the integrated power supply monitor circuit.

* * * * *